United States Patent
Chia et al.

(10) Patent No.: US 10,204,960 B2
(45) Date of Patent: Feb. 12, 2019

(54) METHOD OF FORMING POLYSILICON GATE STRUCTURE IN IMAGE SENSOR DEVICE

(71) Applicant: TAIWAN SEMICONDUCTOR MANUFACTURING CO., LTD., Hsinchu (TW)

(72) Inventors: Chun-Wei Chia, Kaohsiung (TW); Chun-Hao Chou, Tainan (TW); Kai-Chun Hsu, New Taipei (TW); Kuo-Cheng Lee, Tainan (TW); Shyh-Fann Ting, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/857,715

(22) Filed: Sep. 17, 2015

(65) Prior Publication Data

US 2017/0084664 A1 Mar. 23, 2017

(51) Int. Cl.
*H01L 21/28* (2006.01)
*H01L 27/146* (2006.01)
*H01L 29/49* (2006.01)

(52) U.S. Cl.
CPC .. *H01L 27/14689* (2013.01); *H01L 21/28247* (2013.01); *H01L 27/14603* (2013.01); *H01L 29/4916* (2013.01)

(58) Field of Classification Search
CPC ......... H01L 21/28061; H01L 21/28247; H01L 29/66545; H01L 21/28176; H01L 29/518; H01L 27/14603; H01L 29/4916
See application file for complete search history.

(56) References Cited

U.S. PATENT DOCUMENTS

| | | | | |
|---|---|---|---|---|
| 5,612,249 A * | 3/1997 | Sun | ............... | H01L 21/28123 257/E21.206 |
| 6,482,726 B1 * | 11/2002 | Aminpur | ............ | H01L 21/28123 257/E21.206 |
| 6,794,313 B1 * | 9/2004 | Chang | ............... | H01L 21/28035 257/E21.197 |
| 2002/0001935 A1 * | 1/2002 | Kim | ................. | H01L 21/28061 438/595 |
| 2003/0224590 A1 * | 12/2003 | Cho | ................. | H01L 21/28061 438/585 |
| 2004/0110387 A1 * | 6/2004 | Chowdhury | ...... | H01L 21/28061 438/710 |
| 2004/0266154 A1 * | 12/2004 | Lim | ................. | H01L 21/28247 438/592 |
| 2005/0245033 A1 * | 11/2005 | Nam | ................. | H01L 21/32139 438/283 |

(Continued)

*Primary Examiner* — Frederick B Hargrove
(74) *Attorney, Agent, or Firm* — Maschoff Brennan

(57) ABSTRACT

A method of fabricating polysilicon gate structure in an image sensor device includes depositing a gate dielectric layer on a surface of a substrate. Then a polysilicon layer is deposited over the gate dielectric layer. Next, a protection film is deposited over the polysilicon layer. A hard mask is formed over the protection film, and the polysilicon gate structure is patterned. Following that, the hard mask is stripped off. The protection film exhibits etching selectivity against the polysilicon layer and has a thickness of between 40 and 60 angstroms. The hard mask is removed by phosphoric acid solution wet etching process.

20 Claims, 7 Drawing Sheets

(56) References Cited

U.S. PATENT DOCUMENTS

| | | | | |
|---|---|---|---|---|
| 2007/0032010 A1* | 2/2007 | Biery | ............... | H01L 21/28097 438/230 |
| 2007/0066013 A1* | 3/2007 | Lim | ................. | H01L 21/28247 438/257 |
| 2008/0166893 A1* | 7/2008 | Byun | ............... | H01L 21/28044 438/798 |
| 2010/0301421 A1* | 12/2010 | Kronholz | ......... | H01L 21/28088 257/369 |
| 2013/0049082 A1* | 2/2013 | Kato | ................... | H04N 5/3745 257/292 |
| 2015/0035087 A1* | 2/2015 | Li | ..................... | H01L 21/28123 257/411 |
| 2015/0348787 A1* | 12/2015 | Cai | ................... | H01L 21/28035 257/368 |

* cited by examiner

METHOD OF FORMING POLYSILICON GATE STRUCTURE IN IMAGE SENSOR DEVICE

BACKGROUND

Reliability of gate oxides in integrated circuits (IC) is of the utmost importance in providing high performance IC chips. The main performance criteria in image sensor IC are, among others, speed, and packing density. As is well known in the field, scaling down, that is reducing device size, has been the chief vehicle for achieving increased packing density. Scaling down device size in turn, means using smaller channel lengths and widths. To increase the speed, the saturation drain current drain current ($I_{dsat}$) must be increased. It is known that a decrease in either the channel length or the gate oxide thickness ($t_{ox}$) will lead to an increase in $I_{dsat}$.

While the benefits of using thin oxides are well known in the field, such oxides must exhibit adequate reliability characteristics under normal circuit operating conditions. As additional contributor to the reliability concerns is the damage caused to thin gate oxides when a metal conductor such as the polysilicon gate over gate oxide is locally charged. Such local charging can occur when a semiconductor wafer is subjected to any number of semiconductor processes involving, for example, plasma etching or ion implantation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
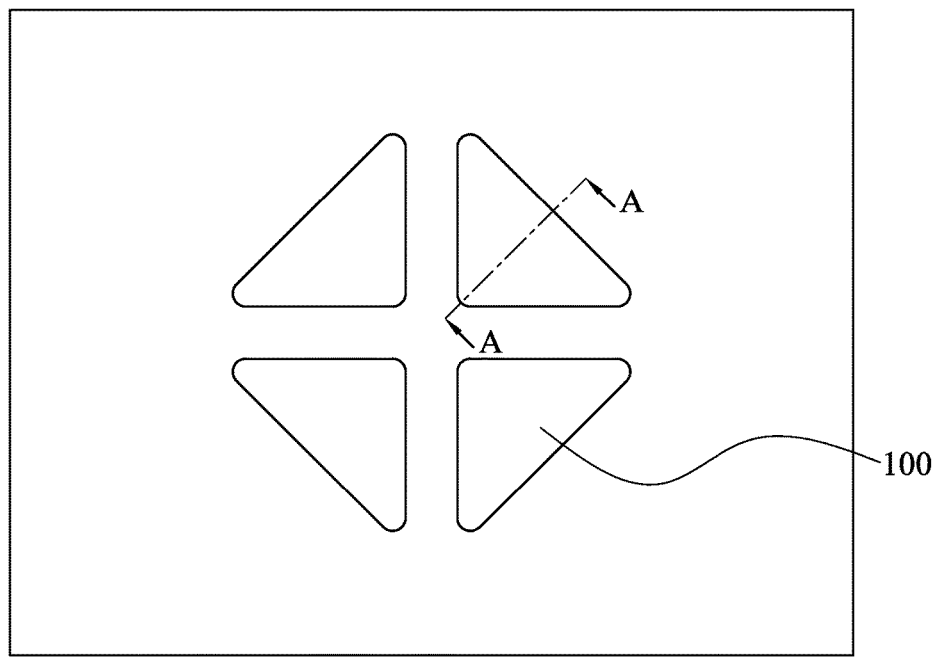
FIG. 1 is a block diagram illustrating an embodiment of a method of fabricating polysilicon gate structure in an image sensor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As microelectronic fabrication integration levels have increased and patterned microelectronic conductor layer dimensions have decreased, it has become increasingly important within the art of microelectronic fabrication to form within patterned microelectronic conductor layers, such as but not limited to gate electrodes within field effect transistors (FETs), as well as patterned microelectronic conductor interconnect layers, with a uniform sidewall profile. Uniform sidewall profiles are particularly desirable within gate electrodes in field effect transistors since gate electrode linewidth and profile define operational parameters of the integrated circuit within which is formed the FET. While a uniform sidewall profile is thus desirable in gate electrodes and other structures in IC devices, uniform sidewalls are, in many cases, not readily achievable.

A conventional process for patterning a polysilicon gate using a hard mask involves a multi-layered semiconductor structure. The polysilicon definition process is initially fabricated on a substrate by sequentially depositing a gate dielectric layer, a polysilicon layer, a hard mask layer, a bottom anti-reflective coating layer and a photo-resist layer on the substrate. Next, the bottom anti-reflective coating layer and the hard mask layer are etched according to the patterned photo-resist layer. This is followed by stripping of the resist layer and the underlying bottom anti-reflective coating layer from the patterned hard mask layer.

Next, the polysilicon layer is etched according to the patterned hard mask layer. This step typically involves etching of the polysilicon layer using, for example, a gas mixture or wet etching. Accordingly, the polysilicon layer, which is etched according to the hard mask layer, remains on the gate dielectric layer.

An issue which frequently results from the etching of the polysilicon layer is that a neck is formed or edges are damaged in the upper end portion of the polysilicon layer. This necking or notched profile is undesirable since optimum semiconductor fabrication requires that the sidewalls of the etched polysilicon layer be as straight and uniform as possible. In an image sensor device, four polysilicon gate structures form one pixel. The damaged edges induce leakage where electrons fail to be drawn, and white pixel appears. The pixel performance is compromised because of damaged polysilicon gate structure, especially at the corner region, in the etching process. Accordingly, a method is provided for the fabrication of a polysilicon gate in such a manner that the incidence of a necking or damaged edge formed in the polysilicon layer is eliminated or at least substantially reduced.

An image sensor is used to convert an optical image focused on the sensor into electrical signals. The image sensor typically includes an array of light detecting elements, where each element produces a signal corresponding to the intensity of light impinging on the element when an image is focused on the array. These signals may then be used, for example, to display a corresponding image on a monitor or otherwise used to provide information about the optical image. Defects on the element surface cause leakage current between the gate electrodes of the image sensor, especially where the substrate defects are caused by etching process. It is therefore of key importance to produce a surface that is free of damage, and more particularly, to prevent current leakage, which results in a phenomenon known as white ribbon or white pixels. It is difficult to sense and control the etch stop above the polysilicon layer.

Please refer first to a top view of a pixel in an image sensor device that is shown in FIG. 1. A typical pixel 20 includes four polysilicon gate structures 200. Each of the polysilicon gate structures resembles a right isosceles triangle with relatively round corners. The vertex angle of the polysilicon gate structure 200 is directed to a centre region, and the sides align with the adjacent gate structure 200 as shown in FIG. 1. A method is provided to minimize the surface defect to the polysilicon gate structure 200 and prevent current leakage, which leads to white pixels. FIGS. 3A through 5 are schematic cross-sectional view along the line AA shown in FIG. 1.

Figure 2:
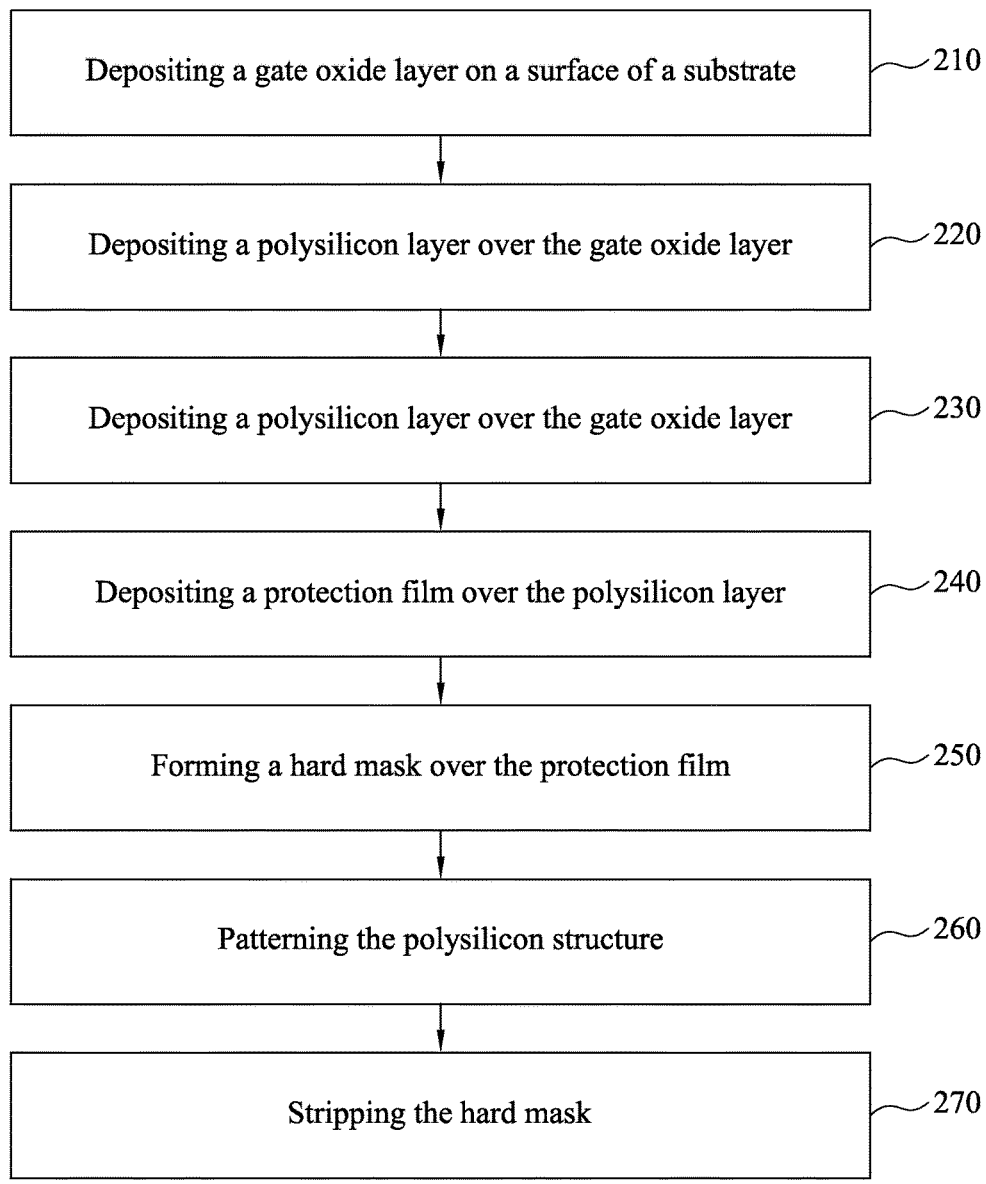
FIG. 2 is a schematic top view diagram illustrating an embodiment of a pixel.

Turning now to FIG. 2, illustrated is an embodiment of a method 200 of fabricating a polysilicon gate structure in image sensor device. Embodiments of the method 200 shown in FIG. 1 are further illustrated in the schematic diagrams of FIGS. 3A through 3F, and reference should be made to these figures as called out in the text below.

Figure 3A:
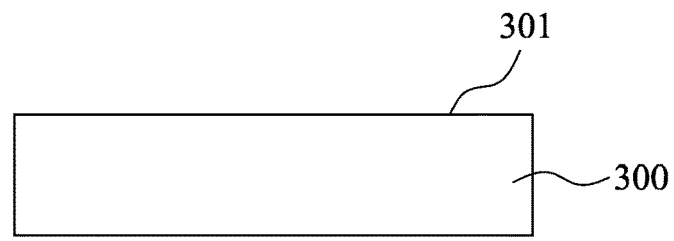
FIGS. 3A-3F are schematic cross-sectional diagrams illustrating embodiments of the method shown in FIG. 1.

Referring to FIG. 3A, a substrate 300 is shown. The substrate 300 is typically a silicon semiconductor wafer and may include active and passive IC devices fabricated within the wafer. Additionally or alternatively, devices may be fabricated in layers formed on the wafer. The substrate 300 may be a semiconductor wafer of any size. The substrate 300 has a surface 301 and a gate dielectric layer and a polysilicon layer are then stacked on the surface 301.

Figure 3B:
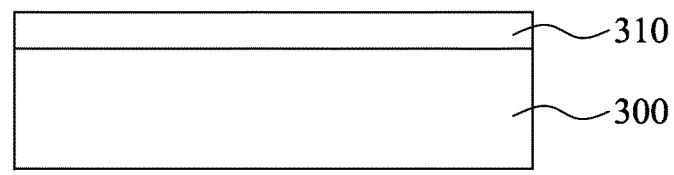

As set forth in block 210 in FIG. 1, a gate dielectric layer is deposited on a surface of a substrate. This is illustrated in FIG. 3B, which shows the substrate 300 and a gate dielectric layer 310. The gate dielectric layer 310 is usually formed as a silicon dioxide material but may be a composite oxide, such as tetra-ethyl-ortho-silicate (TEOS) and silicon dioxide, or a nitride oxide layer or the like. The gate dielectric layer 310 may be silicon dioxide, thermally grown in an oxygen-steam ambient at a temperature between 800 and 1,000 degree Celsius to a thickness of about 10 and 100 angstroms. Alternatively, other methods of oxidation can be used for the formation of the gate dielectric layer 310, such as oxidation in a dry oxygen and anhydrous hydrogen chloride in an atmospheric or low pressure environment, or in a low temperature, high pressure environment and the like. The gate dielectric layer 310 can also be grown by rapid thermal oxidation (RTO) of the surface 301 of substrate 300.

Figure 3C:
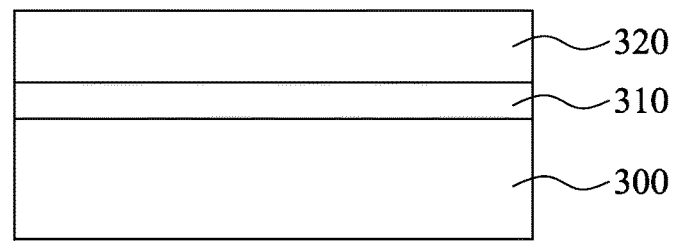

As set forth in block 220, a polysilicon layer is deposited over the gate dielectric layer. This is illustrated in FIG. 3C, which shows the polysilicon layer 320 disposed on the gate dielectric layer 310. The polysilicon layer 320 can be deposited to a thickness between about 200 and 5000 angstroms. The polysilicon layer 320 may be deposited using method of low pressure chemical vapour deposition (LPCVD) at a temperature between about 500 and 650 degrees Celsius. The polysilicon layer 320 may be grown using in situ doping procedures by doping with arsenic or phosphine in a saline ambient. The polysilicon layer 320 may also be deposited intrinsically and doped via impurity ion implant of arsenic or phosphorous. The polysilicon layer 320 may also include polysilicon germanium and may be deposited as indicated above. After deposition of the polysilicon layer 320 on the gate dielectric layer 310, the polysilicon layer may be annealed to cause diffusion of dopant ions through the polysilicon layer 320. The polysilicon anneal step also activates the chemical bonds between the dopant atoms and the silicon atoms in the polysilicon, such that the dopant atoms become a port of the crystalline polysilicon lattice structure in a process known as electrical activation. Alternatively, the polysilicon anneal step may be omitted.

Figure 3D:
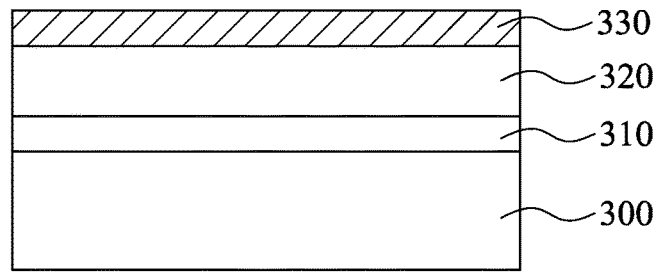

As set forth in block 240, a protection film is deposited over the polysilicon layer. This is illustrated in FIG. 3D, which shows a protection film 330 disposed over the polysilicon layer 320. The protection film 330 is formed by chemical vapour deposition (CVD). The material of the protection film 330 may be any oxide that exhibits etching selectivity between silicon oxynitride, which is the material of the hard mask formed in the subsequent step. The protection film 330 may be deposited to a thickness of between 50 and 100 angstroms.

Figure 3E:
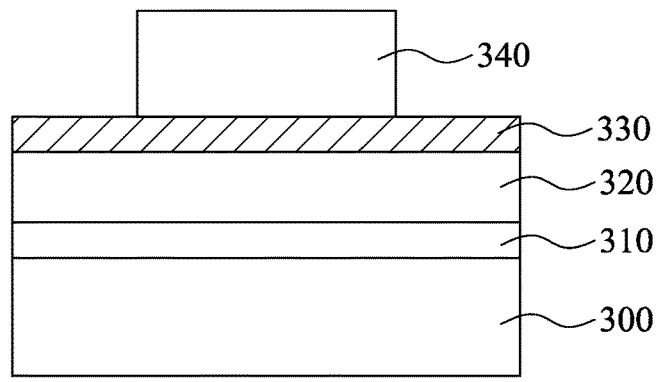

As set forth in block 250, a hard mask is formed on the protection film. This is illustrated in FIG. 3E, which shows a patterned hard mask 340 formed on the protection film 330. The hard mask 340 usually refers to an inorganic masking material. The hard mask 340 may be silicon oxynitride deposited by CVD or plasma enhanced CVD (PECVD) to a thickness of about 200~3000 angstroms. Other materials include phosphosilicate glass (PSG), borophosphosilicate (BPSI), silicon oxide and silicon dioxide obtained from TEOS.

Figure 6:
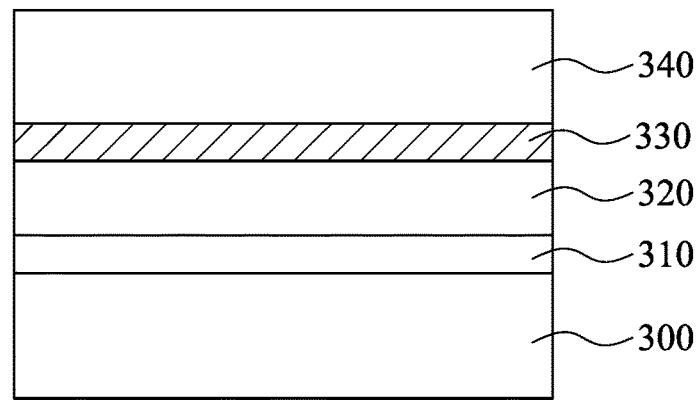
FIGS. 6-9 are schematic cross-sectional diagrams illustrating embodiments of the method shown in FIG. 1.
Figure 7:
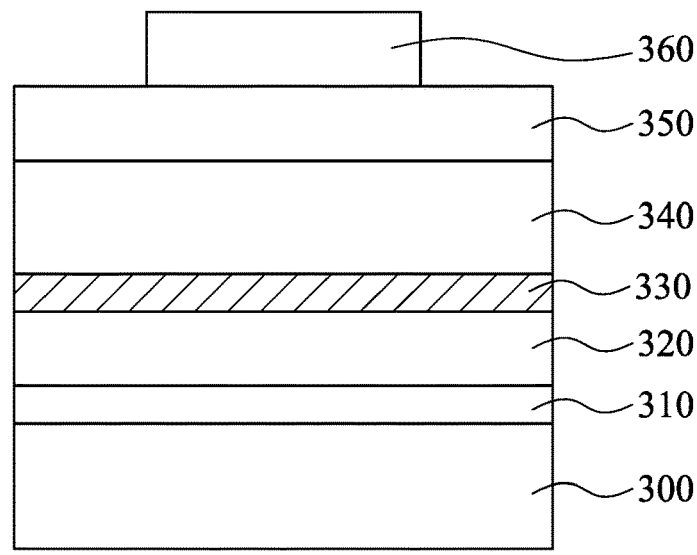

For the sake of clarity, the development of the hard mask 340 is shown in FIGS. 6-9. Referring to FIG. 6, the hard mask layer 340 is deposited on the protection film 330. Next, referring to FIG. 7, a bottom anti-reflective coating (BARC) layer 350 is formed on the hard mask 340. The BARC layer 350 may be made of polymer resin with photo compounds and has a thickness of typically about 200-2000 angstroms. A resist layer 360 is formed over the BARC layer 350 and patterned, exposed and developed to form the pattern that defines the polysilicon gate and other device structure to be fabricated on the substrate 300. The resist layer 360 may be a DUV positive photoresist or any photoresist material such as a negative photoresist.

Figure 8:
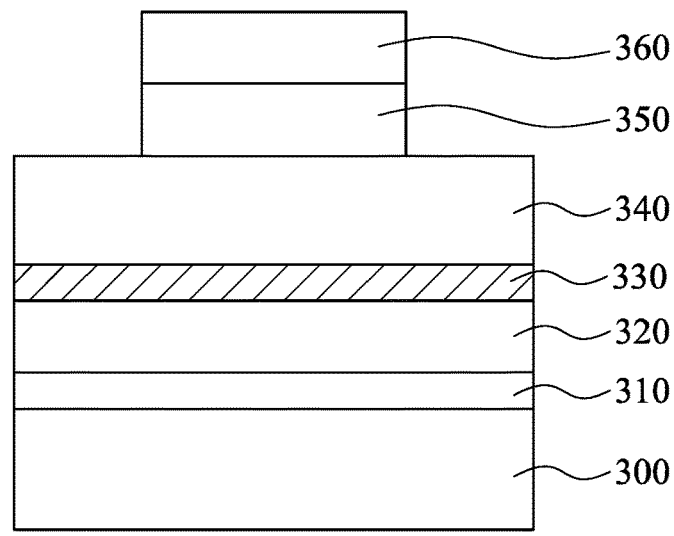
Figure 9:
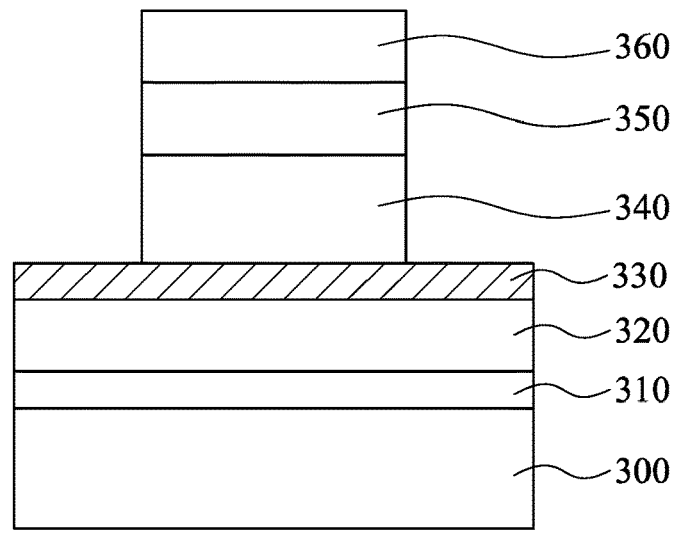

Referring to FIG. 8, the BARC layer 350 is next etched according to the patterned resist layer 360. The etching process for the BARC layer 350 is carried out typically in a high density plasma (HDP) etcher, using a transformer coupled plasma (TCP) etch reaction with bromine and oxygen. As shown in FIG. 9, the hard mask 340 is then etched according to the BARC layer 350 and the patterned resist layer 360. The etching process for the hard mask layer 340 may be carried out in an HDP etcher using a TCP etch reaction with fluorocarbon. The resist layer 360 and the underlying BARC layer 350 are stripped from the hard mask 340. The patterned and etched hard mask 340 remains on the surface of the protection layer 330 as shown in FIG. 3E.

Figure 3F:
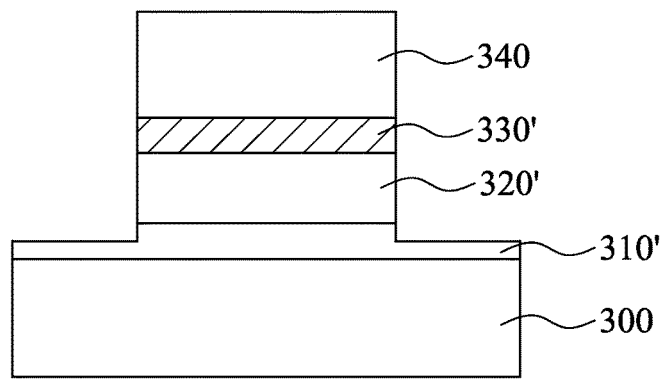

As set forth in block 260, the polysilicon gate structure is patterned. This is illustrated in FIG. 3F, which shows the polysilicon gate structure including the protection film 330', the polysilicon layer 320' and the gate dielectric layer 310' are patterned. The protection film 330, the polysilicon layer 320 and the gate dielectric layer 310 are etched according to the pattern defined by the hard mask 340. The resulting polysilicon gate structure is shown in FIG. 3F, where the portions of the protection film 330, the polysilicon layer 320 and a portion of the gate dielectric layer 310 that are not protected under the hard mask 340 are removed by etching.

Figure 4A:
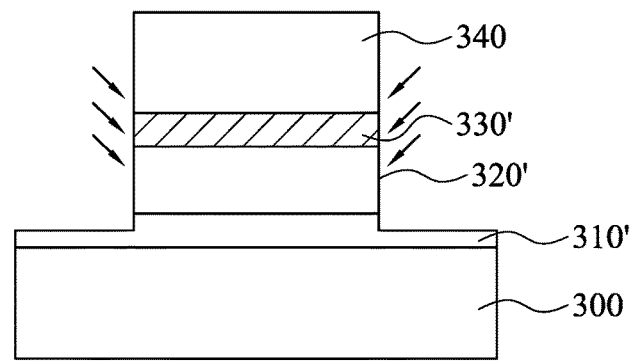
FIGS. 4A-4B are schematic cross-sectional diagrams illustrating embodiments of the method shown in FIG. 1.
Figure 4B:
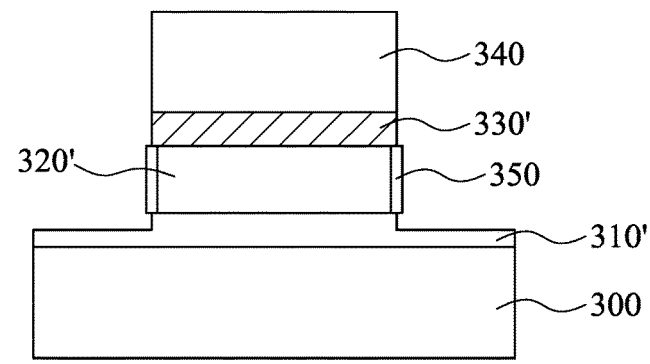

Turning now to FIG. 4A, after the completion of partial etch of the polysilicon gate structure as shown in cross section in FIG. 3F, a step of oxygen based gas exposure is performed. Oxygen is used as a source to treat the polysilicon layer 320'. The exposed sidewalls of the polysilicon layer 320' is under treatment at a temperature of between about 180 and 250 degrees Celsius for a time between about 10 and 15 minutes. The result of the oxygen treatment can be seen in the cross section shown in FIG. 4B. An oxide layer 350 is formed over sidewalls of the polysilicon layer 320'. The oxygen treatment facilitates polysilicon layer 320' self-oxidation, and a thin oxide layer 350 covers any exposed polysilicon layer 320' to a thickness of about 5~15 angstroms. The hard mask 340, protection film 330' and the gate dielectric layer 310' are free of the oxide layer 350 after the oxygen treatment. Only the polysilicon layer 320' reacts with the oxygen source, when $O_2$ flows in to the chamber.

After the oxide layer 350 is formed over the sidewalls of the patterned and etched polysilicon layer 320', the polysilicon gate structure continues with the removal of the hard mask 340. The hard mask 340 is removed by wet etching process involving phosphoric acid chemical. The thickness of the hard mask 340 in a pixel is larger than typical logic, and therefore the etching period stretches longer than normal time. As mentioned previously, it is difficult to sense and control the etch stop of the polysilicon layer 320'. However, in the presence of the protection film 330', even if the wet etching process takes longer than usual, the polysilicon layer 320' is well protected by the protection film 330' and the oxide layer 350 from all sides. When the polysilicon gate structure undergoes wet etching process, the hard mask 340 is gradually consumed by the phosphoric acid chemical. The protection film 330' is capable to resist the wet etchant to a great extent and remains on the top surface of the polysilicon layer 320' after the wet etching process. That is, in the prolonged wet etching process, the polysilicon layer 320' is under the shield constituted by the protection film 330' and the oxide layer 350. The integrity of the polysilicon layer 320' can be well preserved with minimized surface defect because the polysilicon layer 320' is not directly under the attack of the phosphoric acid chemical. It should be understood that the protection film 320 exhibits etching selectivity against silicon oxynitride, which is the key material of the hard mask 340. In the wet etching process, the protection film 320 recedes slightly and most of the protection film 320 is retained over the surface of the polysilicon layer 320'.

In an embodiment in accordance of the instant disclosure, the polysilicon layer 320' has a thickness of about 1000 angstroms. The protection film 330' has a thickness of about 50 angstroms before the wet etching process. After the wet etching process involving phosphoric acid chemicals, the hard mask 340 is completely removed from the polysilicon gate structure, while the remaining protection film 330' has a thickness of about 40 angstroms. In addition to the protection film 330' on the top surface of the polysilicon layer 320', a native oxide layer is formed on the surface of the polysilicon layer 320' throughout the fabrication process. The thickness of the surface film stacking over the polysilicon layer 320' may be up to 70 angstroms. The oxide layer 350 that is formed on the exposed surface of the polysilicon layer 320' after the oxygen treatment also remains on the sidewalls of the polysilicon layer 320' to a thickness of about 10 angstroms after wet etching. The integrity of the polysilicon layer 320' is nearly completely preserved after the prolonged wet etching process because of the protection film 330' and the oxide layer 350 on the sidewalls.

It is important to note that a sharp tip profile is retained into the polysilicon layer 320'. That is, the protection film 330' and the thickening of oxide layer 350 allow corners and surface of the polysilicon layer 320' to be completely preserved. The phenomenon of white pixels is minimized since the polysilicon layer 320' is relatively intact after the polysilicon definition and current leakage is less likely to occur by damaged polysilicon layer.

Figure 5:
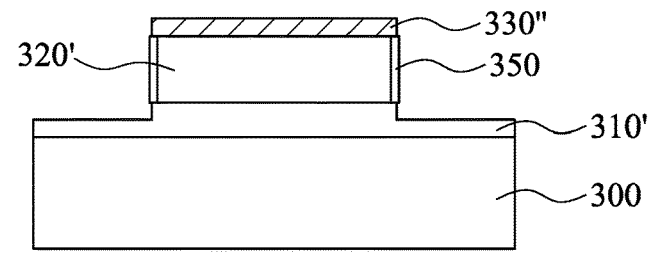
FIG. 5 is a schematic cross-sectional diagram illustrating an embodiment in accordance with the instant disclosure.

Turning now to FIG. 5, illustrated is a polysilicon gate structure. The polysilicon gate structure includes a substrate 300, a gate dielectric layer 310', a polysilicon layer 320', a protection film 330" and an oxide layer 350. The substrate 300 may be a P type semiconductor substrate, including single crystalline silicon. If desired, a P well region can be formed in the region of substrate 300, designed to accommodate the subsequent, photodiode element, of the image sensor device. The gate dielectric layer 310' is formed via conventional photolithographic and reactive ion etching (RIE) and patterning procedures.

A silicon dioxide (not shown), gate insulator, may be thermally grown, followed by the deposition of, and the patterning of, a polysilicon layer 320', creating polysilicon gate structure. The polysilicon layer 320' is obtained via low pressure chemical vapour deposition (LPCVD) procedures, at a thickness of between 200 and 5000 angstroms, with the polysilicon layer doped in situ during deposition via the addition of arsine or phosphine to a silane ambient. The polysilicon layer can also be deposited intrinsically then doped via implantation of arsenic or phosphorous ions. Patterning of the polysilicon layer is accomplished by conventional photolithography and anisotropic RIE procedures, using, for example, $Cl_2$ as an etchant.

The protection film 330" is formed on the top surface of the polysilicon layer 320'. The protection film 330' constitutes an oxide layer showing etching rate selectivity against silicon oxynitride, which is the key ingredient of the polysilicon layer 320'. The protection film 330" is formed by successively deposition of chemical vapour deposition (CVD) process. The protection film 330" may be deposited to a thickness of between 50 and 100 angstroms. The top surface and corners of the polysilicon layer 320' are minimized in exposure to the ambient. The protection film 330" blankets the underlying polysilicon layer 320', serving as an important shield for the polysilicon layer 320' in the fabrication process.

A hard mask is employed for the subsequent polysilicon definition process. The hard mask undergoes conventional photolithography, patterning and development to define the underlying polysilicon gate structure. The exposed region, not covered by the hard mask, is removed by anisotropic etching process. After the partial removal, the polysilicon gate structure obtains its desired configuration.

After the polysilicon definition process, the oxide layer 350 is formed on either side of the polysilicon layer 320'. The oxide layer 350 is formed by thermal deposition process where a surface portion of the polysilicon layer 320' undergoes self-oxidation. When the oxygen ($O_2$) flows into the chamber, the self-oxidation is initialised and a thin oxide layer 350 is formed on the exposed sidewalls of the polysilicon layer 320'. The oxide layer 350 completes the protection coat of the polysilicon layer 320', which is subject to long period of wet etching process in the subsequent fabrication process.

The hard mask used for definition of polysilicon gate structure in the image sensor device is relatively thicker compared with conventional logic structure. The removal of the hard mask is accomplished by a hot phosphoric acid wet etching process under a prolonged period. It is difficult to sense and control the termination of the wet etching process, and very often in the process the polysilicon gate structure is prone to etchant induced damage especially at the surface and edges. Although the polysilicon layer 320' exhibit etching selectivity against the hard mask, to remove the relative thick hard mask, the wet etching process requires longer period and the polysilicon layer 320' may not be able to resist the etchant attack for such a long time. Defects on the surface of the polysilicon layer 320' will lead to failure in electron attraction and further to the phenomenon known as white pixel.

In the presence of the protection film 330" and the oxide layer 350, the polysilicon layer 320' is under full protection from all around. More specifically, the top surface of the polysilicon layer 320' is covered by the protection film 330", and the sidewalls of the polysilicon layer 320' are covered by the oxide layers 350. When the hard mask is to be removed, the polysilicon gate structure is under phosphoric acid solution treatment as well. The protection film 330" specifically protects the polysilicon layer 320' from atop where the most intense wet etching process occurs. After the removal of the hard mask, it is observed that the polysilicon layer 320' is nearly intact, and a considerable portion of the protection film 330" remains on top surface of the polysilicon layer 320'. In an embodiment, the protection film 330" along with native oxide formed on the surface of the polysilicon layer 320' accounts for at least 40 angstroms after phosphoric acid wet etching process. The purpose of surface protection is clearly evidenced by the remaining protection film 330" and the oxide layers 350 on the sidewalls. That is, the polysilicon layer 320' retains its full thickness and a flawless surface for drawing electrons as a pixel component.

Optionally, lightly doped, N type source/drain region is next formed in regions of the substrate 300, not covered by the polysilicon gate structure or occupied by a field oxide region. Lightly doped, N type source/drain region (not shown) is formed via ion implantation procedures, using arsenic or phosphorous ions. If desired, a photodiode element can be subsequently formed in a P well region in the substrate 300. This can be accomplished by formation of P well region by implantation of boron or $BF_2$ ions.

The deposition of protection film over the polysilicon layer serves to protect the underlying material in the wet etching process. The protection film shows etching selectivity against the hard mask, and therefore the protection film is able to resist the etchant attack and retain the integrity of the underlying material, for example, the polysilicon layer. In addition to the top surface shielding, the polysilicon layer undergoes self-oxidation in a thermal process where oxygen flows into the chamber and induces an oxide layer formation on the exposed sidewalls of the polysilicon layer. The polysilicon layer is protected from the top and either side before the prolonged phosphoric acid wet etching process, which is used to remove the hard mask used in the polysilicon definition. As a result, the hard mask can be completely removed without the worry of damaging the underlying polysilicon layer because the protection film exhibits etching selectivity against the hard mask and shields the polysilicon layer from atop. The polysilicon gate structure is one unit of a pixel, which includes four polysilicon gate structures. A defect free polysilicon gate structure ensures electron attraction and minimizing the occurrence of white pixels.

One aspect of the instant disclosure provides a method of fabricating polysilicon gate structure in an image sensor device including depositing a gate dielectric layer on a surface of a substrate. Then a polysilicon layer is deposited over the gate dielectric layer. Next, a protection film is deposited over the polysilicon layer. A hard mask is formed over the protection film, and the polysilicon gate structure is patterned. Following that, the hard mask is stripped off.

Another aspect of the instant disclosure provides a polysilicon gate structure including a silicon substrate having a surface, a gate dielectric, a polysilicon layer and a protection film. The silicon substrate has a surface, and the gate dielectric layer is disposed on the surface of the silicon substrate. The polysilicon layer is disposed on the gate dielectric layer, and the protection film is disposed on the polysilicon layer.

Still another aspect of the present invention provides a method of protecting pixel in an image sensor device including depositing a protection film on a polysilicon layer. Then, a polysilicon hard mask is deposited on the polysilicon layer. Next, the polysilicon layer and the protection film are defined. Subsequently, the polysilicon layer is treated with oxygen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating polysilicon gate structure in an image sensor device, the method comprising:
    depositing a gate dielectric layer on a surface of a substrate;
    depositing a polysilicon layer over the gate dielectric layer;
    depositing a protection film over the polysilicon layer;
    forming a hard mask such that the hard mask is in contact with the protection film;
    patterning the gate dielectric layer, the polysilicon layer, the protection film and the hard mask to form the polysilicon gate structure, wherein the patterned gate dielectric layer has a bottom portion in contact with the surface of the substrate and a top portion between the polysilicon layer and the bottom portion, and the top portion of the patterned gate dielectric layer has a width smaller than a width of the bottom portion of the patterned gate dielectric layer;
    forming an oxide layer on sidewalls of the polysilicon layer; and
    stripping the hard mask by wet etching, wherein the oxide layer is exposed to the entire wet etching and has a reduced thickness after the stripping.

2. The method of fabricating polysilicon gate structure according to claim 1, wherein the forming the oxide layer on the sidewalls of the polysilicon layer comprises:
    oxidizing the polysilicon layer to form the oxide layer.

3. The method of fabricating polysilicon gate structure according to claim 1, wherein the wet etching to strip the hard mask includes wet etching by $H_3PO_4$.

4. The method of fabricating polysilicon gate structure according to claim 1, wherein the protection film includes oxides.

5. The method of fabricating polysilicon gate structure according to claim 1, wherein the patterning the gate dielectric layer, the polysilicon layer, the protection film and the hard mask to form the polysilicon gate structure further comprises:
    forming a bottom anti-reflective coating layer on the hard mask;

forming a resist layer over the bottom anti-reflective coating layer;

patterning the resist layer, the bottom anti-reflective coating layer, and the hard mask; and stripping the patterned resist layer and bottom anti-reflective coating layer.

6. The method of fabricating polysilicon gate structure according to claim 2, wherein the oxidizing the polysilicon layer to form the oxide layer comprises:

treating the polysilicon gate structure with oxygen-based gas.

7. The method of fabricating polysilicon gate structure according to claim 6, wherein the treating the polysilicon gate structure with oxygen-based gas is conducted under a temperature between 180 and 250 degrees Celsius.

8. The method of fabricating polysilicon gate structure according to claim 1, wherein the protection film is above the top portion of the gate dielectric layer.

9. A method of protecting pixel in an image sensor device, comprising:

depositing a protection film on a polysilicon layer;

depositing a hard mask such that the hard mask is in contact with the protection film;

patterning the hard mask, the polysilicon layer, and the protection film to form polysilicon gate structures;

treating the polysilicon layer with oxygen to form an oxide layer on sidewalls of the polysilicon layer; and removing the hard mask by wet etching, wherein the oxide layer is exposed to the entire wet etching and at least a portion of the oxide layer is consumed during the wet etching.

10. The method of protecting pixel in an image sensor device according to claim 9, wherein the protection film has etching selectivity against silicon oxynitride.

11. The method of protecting pixel in an image sensor device according to claim 9, wherein the wet etching is phosphorus wet etching.

12. The method of protecting pixel in an image sensor device according to claim 9, wherein the depositing the protection film comprises:

forming the protection film by chemical vapor deposition.

13. The method of protecting pixel in an image sensor device according to claim 9, wherein the wet etching includes a phosphoric acid chemical.

14. The method of protecting pixel in an image sensor device according to claim 9, wherein the treating the polysilicon layer with oxygen is conducted under a temperature between 180 and 250 degrees Celsius with oxygen-based gas.

15. The method of protecting pixel in an image sensor device according to claim 9, wherein the patterning the hard mask, the polysilicon layer, and the protection film to form the polysilicon gate structures comprises:

forming a bottom anti-reflective coating layer on the hard mask;

forming a resist layer over the bottom anti-reflective coating layer;

patterning the resist layer, the bottom anti-reflective coating layer, and the hard mask; and stripping the patterned resist layer and bottom anti-reflective coating layer.

16. The method of protecting pixel in an image sensor device according to claim 9, wherein the treating the polysilicon layer with oxygen comprises self-oxidation of the polysilicon layer.

17. The method of protecting pixel in an image sensor device according to claim 13, wherein the oxide layer has a thickness of 5-15 angstroms.

18. The method of protecting pixel in an image sensor device according to claim 9, wherein the hard mask has a thickness of 200-3000 angstroms.

19. A method of fabricating polysilicon gate structures, the method comprising:

depositing a gate dielectric layer on a surface of a substrate;

depositing a polysilicon layer over the gate dielectric layer;

depositing a protection film that includes only oxide over the polysilicon layer;

forming a hard mask over the protection film;

patterning the gate dielectric layer, the polysilicon layer, the protection film and the hard mask to form the polysilicon gate structures;

forming an oxide layer on a sidewall of the polysilicon layer such that the entire oxide layer is above a top surface of the gate dielectric layer; and removing the hard mask by wet etching, wherein the oxide layer is exposed to the entire wet etching.

20. The method of fabricating polysilicon gate structures according to claim 19, wherein forming the hard mask is such that the hard mask is in contact with the protection film.

* * * * *